(12) United States Patent
Zheng et al.

(10) Patent No.: US 8,089,063 B2
(45) Date of Patent: Jan. 3, 2012

(54) QUANTUM DOT SOLAR CELL WITH ELECTRON RICH ANCHOR GROUP

(75) Inventors: Zhi Zheng, Shanghai (CN); Wei Jun Wang, Shanghai (CN); Linan Zhao, Shanghai (CN); Yue Liu, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 350 days.

(21) Appl. No.: 12/336,999

(22) Filed: Dec. 17, 2008

(65) Prior Publication Data

US 2009/0159999 A1 Jun. 25, 2009

Related U.S. Application Data

(60) Provisional application No. 61/014,894, filed on Dec. 19, 2007.

(51) Int. Cl.
*H01L 51/44* (2006.01)
(52) U.S. Cl. .................. 257/40; 136/263; 257/E51.015
(58) Field of Classification Search ................. 136/252, 136/263; 257/40, E51.001–E51.052; 438/82, 438/99
See application file for complete search history.

(56) References Cited

U.S. PATENT DOCUMENTS

| | | | |
|---|---|---|---|
| 4,927,721 A | 5/1990 | Gratzel et al. | |
| 5,677,545 A * | 10/1997 | Shi et al. | 257/40 |
| 6,566,595 B2 | 5/2003 | Suzuki | |
| 6,919,119 B2 | 7/2005 | Kalkan et al. | |
| 7,032,209 B2 | 4/2006 | Kobayashi | |
| 7,042,029 B2 | 5/2006 | Graetzel et al. | |
| 7,202,412 B2 | 4/2007 | Yamanaka et al. | |
| 7,202,943 B2 | 4/2007 | Chang et al. | |
| 7,268,363 B2 | 9/2007 | Lenhard et al. | |
| 7,462,774 B2 | 12/2008 | Roscheisen et al. | |
| 7,655,860 B2 | 2/2010 | Parsons | |
| 2004/0106781 A1* | 6/2004 | Emrick et al. | 530/400 |
| 2005/0028862 A1 | 2/2005 | Miteva et al. | |
| 2006/0021647 A1* | 2/2006 | Gui et al. | 136/252 |
| 2006/0169971 A1 | 8/2006 | Cho et al. | |

(Continued)

FOREIGN PATENT DOCUMENTS

EP 1473745 11/2004

(Continued)

OTHER PUBLICATIONS

Landes, C.F., et al. "On the Nanoparticle to Molecular Size Transition: Fluorescence Quenching Studies." J. Phys. Chem. B, vol. 105 (2001): pp. 10554-10558.*

(Continued)

*Primary Examiner* — Matthew W Such
(74) *Attorney, Agent, or Firm* — Seager, Tufte & Wickhem LLC

(57) ABSTRACT

A solar cell may including a quantum dot, an electron conductor and a bridge molecule disposed between the quantum dot and the electron conductor. The bridge molecule may include a quantum dot anchor that bonds to the quantum dot and an electron conductor anchor that bonds to the electron conductor. The quantum dot anchor may be an electron-rich anchor group that includes a Group 5A element. The solar cell may also include a hole conductor that is configured to reduce the quantum dot once the quantum dot absorbs a photon and ejects an electron through the bridge molecule and into the electron conductor.

14 Claims, 6 Drawing Sheets

U.S. PATENT DOCUMENTS

| | | | |
|---|---|---|---|
| 2006/0263908 A1 | 11/2006 | Hirai | |
| 2007/0025139 A1 | 2/2007 | Parsons | |
| 2007/0028959 A1 | 2/2007 | Lee et al. | |
| 2007/0062576 A1 | 3/2007 | Duerr et al. | |
| 2007/0119048 A1 | 5/2007 | Li et al. | |
| 2007/0120177 A1 | 5/2007 | McGregor et al. | |
| 2007/0122927 A1 | 5/2007 | Li et al. | |
| 2007/0123690 A1 | 5/2007 | Parham et al. | |
| 2007/0243718 A1 | 10/2007 | Shiratori et al. | |
| 2008/0110494 A1 | 5/2008 | Reddy | |
| 2008/0264479 A1 | 10/2008 | Harris et al. | |
| 2009/0114273 A1* | 5/2009 | Kamat | 136/252 |
| 2009/0159120 A1 | 6/2009 | Wang et al. | |
| 2009/0159124 A1 | 6/2009 | Mihaila et al. | |
| 2009/0159131 A1 | 6/2009 | Zheng et al. | |
| 2009/0211634 A1 | 8/2009 | Serban et al. | |
| 2009/0260682 A1 | 10/2009 | Serban et al. | |
| 2009/0260683 A1 | 10/2009 | Serban et al. | |
| 2009/0283142 A1 | 11/2009 | Serban et al. | |
| 2010/0006148 A1 | 1/2010 | Zheng et al. | |
| 2010/0012168 A1 | 1/2010 | Mihaila et al. | |
| 2010/0012191 A1 | 1/2010 | Serban et al. | |
| 2010/0043874 A1 | 2/2010 | Liu | |
| 2010/0116326 A1 | 5/2010 | Gur et al. | |
| 2010/0193025 A1 | 8/2010 | Serban et al. | |
| 2010/0193026 A1 | 8/2010 | Serban et al. | |
| 2010/0326499 A1 | 12/2010 | Liu | |

FOREIGN PATENT DOCUMENTS

| | | |
|---|---|---|
| EP | 1689018 | 8/2006 |
| EP | 1936644 | 6/2008 |
| JP | 2008177099 | 7/2008 |
| WO | WO 2004/017345 | 2/2004 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

Snaith, H.J., et al. "Self-Organization of Nanocrystals in Polymer Brushes. Application in Heterojunction Photovoltaic Diodes." Nanolett., vol. 5 (2005): pp. 1653-1657.*

Plass, R., et al. "Quantum Dot Sensitization of Organic—Inorganic Hybrid Solar Cells." J. Phys. Chem. B, vol. 106 (2002): pp. 7578-7580.*

Sharma, S.N., et al. "Photoinduced Charge Transfer Between CdSe Quantum Dots and p-Phenylenediamine." J. Phys. Chem. B, vol. 107 (2003): pp. 10088-10093.*

Gebeyehu, D., et al. "Hybrid Solar Cells Based on Dye-Sensitized Nanoporous TiO2 Electrodes and Conjugated Polymers as Hole Transport Materials." Synth. Met., vol. 125 (2002): pp. 279-287.*

Diguna et al., "High Efficiency of CdSe Quantum-Dot-Sensitized TiO2 Inverse Opal Solar Cells," Applied Physics Letters, vol. 91, No. 023116, 3 pages, 2007.

Afzal, "Studies of Cephradine Metal Interactions," 342 pages, Oct. 1998.

Anacona et al., "Synthesis and Antibacterial Activity of Cefotaxime Metal Complexes," Journal of the Chilean Chemical Society, vol. 50, No. 2, 7 pages, Jun. 2005.

Anacona et al., "Synthesis and Antibacterial Activity of Cefoxitin Metal Complexes," Transition Metal Chemistry, vol. 30, pp. 605-609, 2005.

Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.

Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.

Diol Et al., "Electron Transfer Dynamics at GaAs Surface Quantum Wells," Journal of Physical Chemistry B, vol. 102, pp. 6193-6201, 1998.

El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.

Enescu, Medicamente, pp. 292-293, 2005.

Enright et al., "Spectroscopic Determination of Electron and Hole Effective Masses in a Nanocrystalline Semiconductor Film," Journal of Physical Chemistry vol. 100, No. 3, pp. 1027-1035, 1996.

Galoppini, "Linkers for Anchoring Sesitizers to Semiconductor Nanoparticles," Coordination Chemistry Reviews vol. 248, pp. 1283-1297, 2004.

Gautam et al., "Soft Chemical Routes to Semiconductor Nanostructures," Pramana Journal of Physics, vol. 65, No. 4, pp. 549-564, Oct. 2005.

Gregg, "Excitonic Solar Cells," Journal of Physical Chemistry B., vol. 107, pp. 4688-4698, No. 20, May 1, 2003.

Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.

http://en.wikipedia.org/wiki/Quantum_dot_solar_cell, "Nanocrystal Solar Cell," 1 page, printed Oct. 17, 2007.

http://findarticles.com/articles/mi_qa3776/is_200605ai_n17176721/print, "Ultradense GaN Nanopillar and Nonopore Arrays by Self-Assembly Nanopatterning," 4 pages, May 5, 2008.

http://www.evidenttech.com, Evident Technologies Webpages, 11 pages, printed Oct. 17, 2007.

http://www.i-sis.org.uk/QDAUESC.php, "Quantum Dots and Ultra-Efficient Solar Cells?" ISIS Press Release, Jan. 19, 2006.

Hwang et al., "A Highly Efficient Organic Sensitizer for Dye-Sensitized Solar Cells," Chemical Communications, 5 pages, printed Sep. 27, 2007.

ISBN No. 7-04-009141-0, 8 pages, 2001, 2003.

ISBN No. 978-7-03-015873-4, 8 pages, 2005.

Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.

Kim et al., "Enhanced Photocatalytic Activity in Composites of $TiO_2$ Nanotubes and Cds Nanoparticles," Chem. Commun., pp. 5024-5026, 2006.

Klimov, "Spectral and Dynamical Properties of Multiexcitons in Semiconductor Nanocrystals," ANRV, vol. 308-PC58-24, pp. 635-673, Dec. 2, 2006.

Kouklin et al., "Ultradense GaN Nanopillar and Nanopore Arrays by Self-Assembly and Nanopatterning," Journal of Electronic Materials, vol. 35, No. 5, pp. 1133-1137, May 2006.

Kuzyk, "Erratum: Physical Limits on Electronic Nonlinear Molecular Susceptibilities," Physical Review Letters, vol. 90, No. 3, 1 page, Jan. 2003.

Kuzyk, "Fundamental Limits on Third-Order Molecular Susceptibilities," Optics Letters, vol. 25, No. 16, pp. 1183-1185, Aug. 15, 2000.

Kuzyk, "Physical Limits on Electronic Nonlinear Molecular Susceptibilities," Physical Review Letters, vol. 85, No. 6, pp. 1218-1221, Aug. 7, 2000.

Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.

Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.

Li et al., "Band-Structure-Corrected Local Density Approximation Study of Semiconductor Quantum Dots and Wires," Physical Review B., vol. 72, 15 pages, 2005.

Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, 11 pages, May 1956.

Marcus, "On the Theory of Oxidation-Reduction Reactions Involving Electron Transfer. I," The Journal of Chemical Physics, vol. 24, No. 5, 13 pages, May 1956.

Meier et al., "Fast Electron Transfer Across Semiconductor-Molecule Interfaces: GaAs/Co(Cp)$_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized TiO$_2$ Solar Cells: Shielding Versus Band-Edge Movement," Journal of Physical Chemistry B., vol. 109, No. 49, pp. 23183-23189, 2005.

Nenitescu, Chimie Organica, vol. I, p. 522, 1980.

Nenitescu, Chimie Organica, vol. II, p. 581, 1980.

Nilsing et al., "Phosphonic Acid Adsorption at the TiO$_2$ Anatase (101) Surface Investigated by Periodic Hybrid HF-DFT Computations," Surface Science, vol. 582, pp. 49-60, 2005.

Nozick et al., "Quantum Dot Solar Cells," Physica E, vol. 14, pp. 115-120, 2002.

O'Reagan et al., "A Low-Cost, High Efficiency Solar Cell Based on Dye-Sensitized Colloidal TiO$_2$ Films," Nature, vol. 353, pp. 737-740, Oct. 24, 1991.

Oyaizu et al., "Linear Ladder-Type Conjugated Polymers Composed of Fused Thiophene Ring Systems," Macromolecules, vol. 37, No. 4, pp. 1257-1270, 2004.

Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.

Perez-Moreno et al., "Modulated Conjugation as a Means for Attaining a Record High Intrinsic Hyperpolarizability," Optics Letters, vol. 32, No. 1, pp. 59-61, Jan. 1, 2007.

Pomerantz et al., "Synthesis and Properties of Poly[3-(w-bromoalkyl)thiophene]," Synthetic Metals, vol. 101, 1 page, 1999.

Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.

Qian et al., "Gallium Nitride-Based Nanowire Radial Heterostructures for Nanophotonics," NanoLetters, vol. 4, No. 10, pp. 1975-1979, 2004.

Qiu et al., "Fabrication of TiO$_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic TiO$_2$ Films," Journal of the American Chemical Society, vol. 128, No. 7, pp. 2385-2393, 2006.

Robel et al., "Size-Dependent Electron Injection from Excited CdSeQuantum Dots into TiO$_2$ Nanoparticles," JACS Communications, 2 pages, Mar. 21, 2007.

Wang et al. "Enhance the Performance of Dye-Sensitized Solar Cells by Co-grafting Amphiphilic Sensitizer and Hexadecylmalonic Acid on TiO$_2$ Nanocrystals," Journal of Physical Chemistry B., vol. 107, No. 51, pp. 14336-14341, 2003.

Wu et al., "Superior Radiation Resistance of In$_{1-x}$Ga$_x$N Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline TiO$_2$ Films by Organic Sensitizers," Chemical Communications, 7 pages, printed Sep. 27, 2007.

Chang et al., "Chemical Bath Deposition of CdS Quantum Dots Onto Mesoscopic TiO$_2$ Films for Application in Quantum-Dot-Sensitized Solar Cells," Applied Physics Letters, vol. 91, 3 pages, 2007.

U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829, filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.

Hodes, "Chemical Solution Deposition of Semiconductor Films," Marcel Dekker Inc., 381 pages, 2002.

Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

Banerjee et al., "Synthesis and Characterization of Carbon Nanotube-Nanocrystal Heterostructures," Nano Letters, vol. 2, No. 3, pp. 195-200, 2002.

Clarke et al., "Photophysics of Dopamine-Modified Quantum Dots and Effects on Biological Systems," Nature Materials, vol. 5, pp. 409-417, May 2006.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Law et al., "ZnO—Al$_2$O$_3$ and ZnO—TiO$_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798 2007.

Ma et al., "A Sensitive Method for the Detection of Catecholamine Based on Fouresence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Quintana et al, "Comparison of Dye-Sensitized ZnO and TiO$_2$ Solar Cells: Studies of Charge Transport and Carrier Lifetime," pp. 1035-

1041, Journal Phys. Chemistry C, vol. 111, No. 2, pp. 1035-1041, 2007 (published on web Dec. 14, 2006).

Wu et al., "Phosphate-Modified TiO$_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

* cited by examiner

QUANTUM DOT SOLAR CELL WITH ELECTRON RICH ANCHOR GROUP

PRIORITY

This application claims priority to provisional application Ser. No. 61/014,894 filed Dec. 19, 2007 entitled "QUANTUM DOT SOLAR CELL WITH ELECTRON RICH ANCHOR GROUP", which application is incorporated herein by reference.

TECHNICAL FIELD

The disclosure relates generally to solar cells and more particularly to quantum dot solar cells.

SUMMARY

The disclosure relates generally to solar cells. In an illustrative but non-limiting example, the disclosure relates to a solar cell that includes a quantum dot, an electron conductor and a hole conductor. A bridge molecule may be disposed between the quantum dot and the electron conductor. The bridge molecule may include an electron rich anchor that is bonded to the quantum dot and an electron conductor anchor that is bonded to the electron conductor. The hole conductor layer may be in contact with the quantum dot layer, and may be configured to reduce the quantum dot once the quantum dot absorbs a photon and ejects an electron through the bridge molecule and into the electron conductor.

In another illustrative but non-limiting example, the disclosure relates to a light sensitive assembly that includes a quantum dot, an electron conductor and a bridge molecule that is disposed between the quantum dot and the electron conductor. The bridge molecule may, for example, include an electron rich anchor that bonds to the quantum dot as well as an electron conductor anchor that bonds to the electron conductor.

The above summary is not intended to describe each disclosed embodiment or every implementation of the disclosure. The Figures and Detailed Description which follow more particularly exemplify these embodiments.

BRIEF DESCRIPTION OF THE FIGURES

The following description should be read with reference to the drawings, in which like elements in different drawings are numbered in like fashion. The drawings, which are not necessarily to scale, depict selected embodiments and are not intended to limit the scope of the disclosure. The disclosure may be more completely understood in consideration of the following detailed description of various embodiments in connection with the accompanying drawings, in which.

Figure 1:
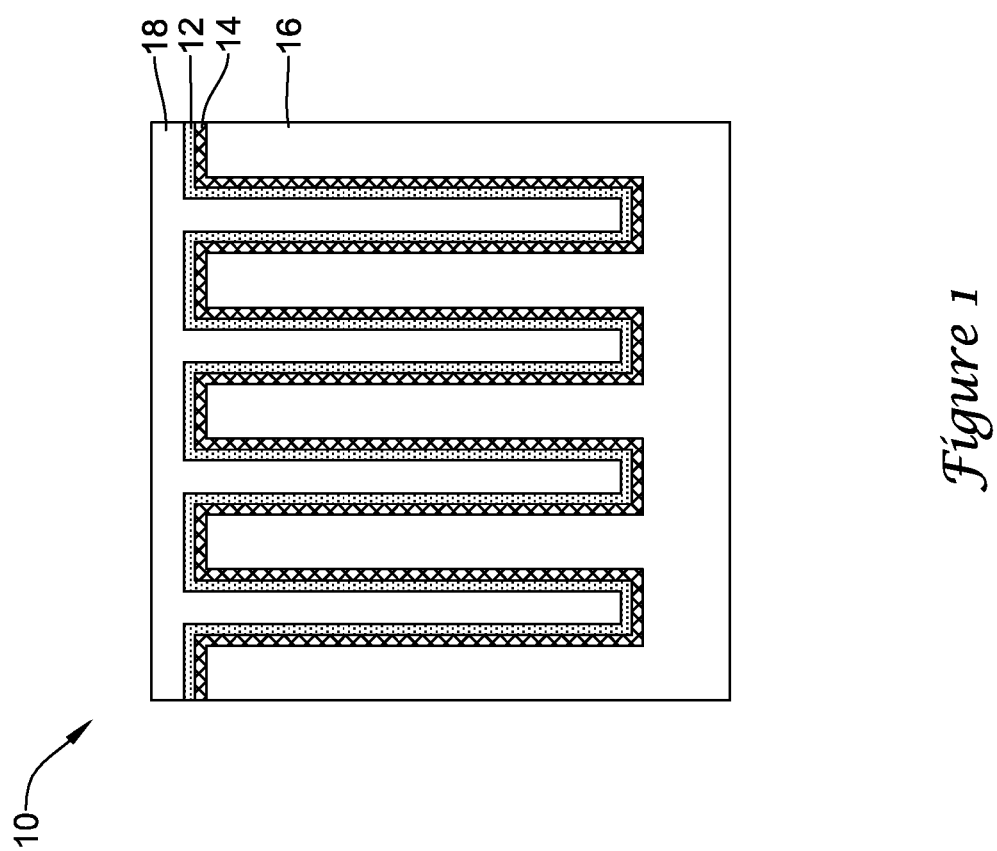
FIG. 1 is a schematic cross-sectional side view of an illustrative but non-limiting example of a solar cell.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

FIG. 1 is a schematic cross-sectional side view of an illustrative solar cell 10. In the illustrative example shown in FIG. 1, there is a three-dimensional intermingling or interpenetration of the layers forming solar cell 10, but this is not required. The illustrative solar cell 10 includes a quantum dot layer 12. Quantum dot layer 12 may schematically represent a single quantum dot. In some cases, quantum dot layer 12 may be considered as representing a large number of individual quantum dots. In the illustrative embodiment of FIG. 1, a bridge layer 14 is provided, and may schematically represent a single rigid bridge molecule, such as those discussed below. In some cases, bridge layer 14 may represent a large number of individual rigid bridge molecules, with at least some of the rigid bridge molecules within bridge layer 14 bonded to corresponding quantum dots within quantum dot layer 12. The illustrative solar cell 10 also includes an electron conductor layer 16. In some cases, electron conductor layer 16 may be an n-type conductor as discussed below.

The illustrative solar cell 10 may further include a hole conductor layer 18. As discussed below, hole conductor layer 18 may be a p-type conducting electrode layer. In some instances, hole conductor layer 18 may represent an electrolyte solution that is in contact with quantum dot layer 12 such that the electrolyte solution can reduce, i.e., replace electrons, within quantum dot layer 12 when incident photons cause individual quantum dots within quantum dot layer 12 to eject electrons through bridge layer 14 and into electron conductor layer 16. Quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups II-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb. Additional examples of quantum dot materials include $CuInSe_2$, $CuS_2$, $AgS_2$, CdSe/ZnS core/shell structure, CdSe/ZnSe core/shell structure and others.

Figure 2:
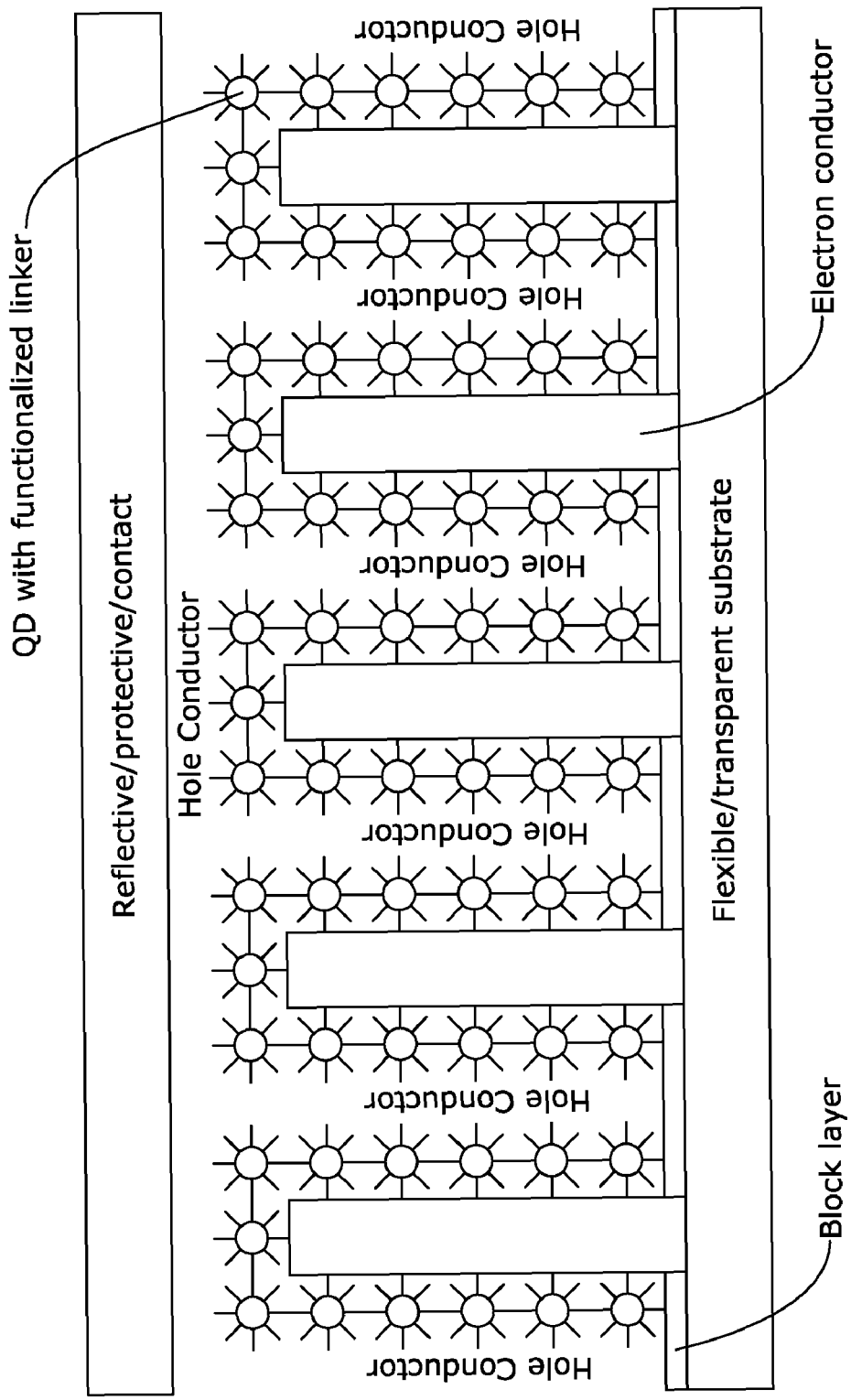
FIG. 2 is a schematic cross-sectional side view of another illustrative but non-limiting example of a solar cell.

FIG. 2 is a schematic cross-sectional side view of an illustrative solar cell that is similar to solar cell 10 (FIG. 1). In some cases, a reflective and/or protecting layer may be disposed over the hole conductor layer, as shown. The reflective and/or protecting layer may be a conductive layer. In some instances, the reflective and/or protecting layer may include a Pt/Au/C film as both catalyst and conductor, but this is not required. Alternatively, or in addition, a flexible and transparent substrate, shown at the lower side (in the illustrated orientation) of FIG. 2, may be an electron conductor such as an n-type electron conductor. The n-type electron conductor may be transparent or at least substantially transparent to at least some wavelengths of light within the visible portion of the electromagnetic spectrum.

As described with respect to FIG. 1, solar cell 10 may include a bridge layer 14. Bridge layer 14 may include a single bridge molecule or a large number of bridge molecules. In some cases, the bridge molecule may provide a conduit so that electrons that are ejected by the quantum dot(s) can travel to the electron conductor. The bridge molecule may also secure the quantum dot relative to the electron conductor and/or any other related structure.

The bridge molecule may be considered as including several segments or portions. These segments or portions may include an electron conductor anchor that may be considered as bonding to the electron conductor, a quantum dot anchor that may be considered as bonding to the quantum dot, and a bridge portion disposed between the quantum dot anchor and the electron conductor anchor.

The electron conductor anchor, which may be bonded to the bridge portion or otherwise be formed as a portion thereof, may be a molecular group or moiety that has an affinity for bonding to the electron conductor. In some cases, the electron conductor anchor may include a carboxylic acid moiety or a phosphonic acid moiety.

The quantum dot anchor, which may be bonded to the bridge portion or otherwise be formed as a portion thereof, may be a molecular group or moiety that has an affinity for bonding to the quantum dot(s). In some instances, the electron rich anchor may include or be formed from a moiety that includes a group 5A element such as nitrogen or phosphorous.

In some cases, the group 5A element may be $Sp^3$ hybridized, and thus may have a lone pair of electrons in its outermost orbitals. The metal component of a quantum dot, such as, for example, cadmium in a CdTe quantum dot has unoccupied orbitals. As a result, the lone pair of electrons in the electron rich quantum dot anchor may easily form coordination bonds with the metal component. In some cases, the group 5A elements may be less likely to oxidize than the thiols, which can be used as quantum dot anchors.

Illustrative but non-limiting examples of quantum dot anchors that include $sp^3$-hybridized orbitals include quantum dot anchors in which the group 5A element is nitrogen. In some cases, the quantum dot anchor may be an aliphatic amine such as a primary amine, a secondary amine or a tertiary amine. It will be recognized that similar molecular groups based on phosphorous are contemplated as well.

In some instances, the quantum dot anchor may be considered as having the following structure:

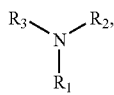

where $R_1$, $R_2$ and $R_3$ are each independently hydrogen, linear alkyl, branched alkyl, or cycloalkyl. With respect to the specific structures shown below, it should be recognized that the quantum dot anchors may, in some cases, have fewer carbon atoms than shown or may have more carbon atoms than shown.

An illustrative but non-limiting example of a quantum dot anchor is butylamine, which has the following structure:

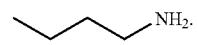

Another illustrative but non-limiting example of a quantum dot anchor is dibutylamine, which has the following structure:

Another illustrative but non-limiting example of a quantum dot anchor is tributylamine, which has the following structure:

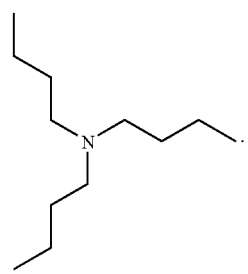

Another illustrative but non-limiting example of a quantum dot anchor is decylamine, which the structure:

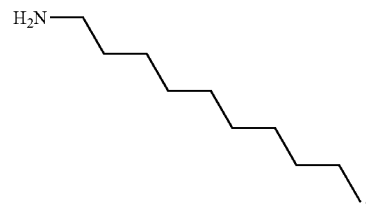

Another illustrative but non-limiting example of a quantum dot anchor is 1-methylbutylamine, which has the structure:

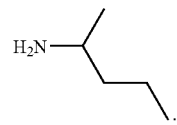

Another illustrative but non-limiting example of a quantum dot anchor is aminocyclohexane, which has the structure:

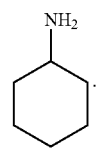

In some cases, the group 5A element may be $Sp^2$ hybridized, and thus may have a lone pair of electrons in its outermost orbitals. The metal component of a quantum dot, such as, for example, cadmium in a CdTe quantum dot has unoccupied orbitals. As a result, the lone pair of electrons in the electron rich quantum dot anchor may easily form coordination bonds with the metal component.

An illustrative but non-limiting example of a quantum dot anchor having sp² hybridization includes molecules having the structure:

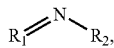

where $R_1$ and $R_2$ form part of a ring structure. It will be recognized that similar molecular groups based on phosphorous are contemplated as well.

An illustrative but non-limiting example of a quantum dot anchor is pyridine, which has the structure:

In some instances, a quantum dot anchor may be of the following structure:

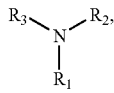

where $R_1$ and $R_2$ each form part of a ring and $R_3$ is hydrogen, and the nitrogen atom has a p orbital that is perpendicular to a Sp² plane. It will be recognized that similar molecular groups based on phosphorous are contemplated as well.

An illustrative but non-limiting example of a quantum dot anchor includes pyrrole, which has the structure:

Another illustrative but non-limiting example of a quantum dot anchor includes indole, which has the structure:

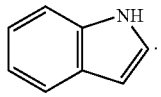

Another illustrative but non-limiting example of a quantum dot anchor includes carbazole, which has the structure:

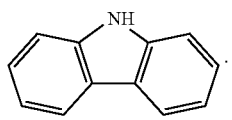

Another illustrative but non-limiting example of a quantum dot anchor includes triphenylamine, which has the structure:

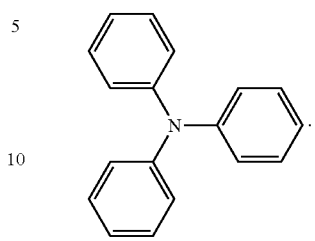

Another illustrative but non-limiting example of a quantum dot anchor includes a diazo compound having the structure:

where R is an aliphatic or aromatic group. It will be recognized that similar molecular groups based on phosphorous are contemplated as well.

As noted above, a light sensitive assembly may include a bridge molecule. In some cases, the bridge molecule may include an alkyl bridge portion such as propane ($C_3H_8$) or decane ($C_{10}H_{22}$), although other carbon chain lengths are contemplated. An alkyl bridge portion may be cyclic or acyclic. It is considered that in some cases, an alkyl portion of the quantum dot anchors described above may itself form part or all of the bridge portion of the bridge molecule.

In some instances, the bridge portion of the bridge molecule may be a conjugated molecule in which the alternating single and double bonds may enhance electron transfer. Examples of suitable conjugated molecules may be found in commonly owned patent application Ser. No. 12/336,917, filed on the even date herewith, having the title QUANTUM DOT SOLAR CELL WITH CONJUGATED BRIDGE MOLECULE, the entire disclosure of which is incorporated herein by reference.

In some cases, the bridge portion of the bridge molecule may be a rigid molecule such as a bicyclic ring molecule. Having a rigid bridge portion may improve the stereochemistry of the light sensitive assembly and thus may improve efficiency. Examples of suitable bicyclic ring molecules may be found in commonly owned patent application Ser. No. 12/336,859, filed on the even date herewith having the title QUANTUM DOT SOLAR CELL WITH RIGID BRIDGE MOLECULE, the entire disclosure of which is incorporated herein by reference.

In some cases, a solar cell may include a bridge molecule having a quantum dot anchor group bonded to a quantum dot and an electron conductor anchor group bonded to an electron conductor. The solar cell may include a hole conductor that is configured to reduce the quantum dot once the quantum dot has absorbed a photon and ejected an electron through the bridge molecule to the electron conductor.

Referring back to FIG. 1, the illustrative solar cell 10 may include an electron conductor layer 16, which may be formed of any suitable material. In some instances, electron conductor layer 16 may be formed of a wide bandgap semiconductor. Illustrative but non-limiting examples include $TiO_2$, ZnO, $SnO_2$ and $ZnO/TiO_2$ core/shell structures. In some cases, electron conductor layer 16 may be an electrically conducting polymer such as a polymer that has been doped to be electrically conducting or to improve its electrical conductivity.

As discussed with respect to FIG. 1, the illustrative solar cell 10 may include a hole conductor layer 18. A variety of hole conductors are contemplated. In some cases, for example, hole conductor layer 18 may be a p-type electrically conductive polymer. Any suitable p-type conductive polymer may be used, such as P3HT, or poly(3-hexyl thiophene), poly[3-(ω-mercapto hexyl)]thiophene, poly[3-(ω-mercapto undecyl)]thiophene, poly[3-(ω-mercapto dodecyl)] thiophene, MEH-PPV, or poly[2,5-dimethoxy-1,4-phenylene-1,2-ethenylene,2-methoxy-5-2-ethylhexyloxy-1,4-phenylene-1,2-ethylene), PPP, or poly(p-phenylene), TFB, or poly(9,9-dioctylfluorene-co-N-(4-(3-methylpropyl)-diphenylamine), and the like.

In some cases, the hole conductor layer 16 may be an electrolyte. An illustrative but non-limiting example of an electrolyte may be formed by dissolving suitable redox materials such as combinations of metal iodides with iodine or combinations of metal bromides with bromine. Examples of suitable metal iodides include LiI, NaI, KI, $CaI_2$ and $MgI_2$. Examples of suitable metal bromides include LiBr, NaBr, KBr and $CaBr_2$. Examples of suitable solvents include but are not limited to carbonate compounds and nitrile compounds.

In some instances, it is contemplated that the hole conductor may itself absorb light and produce excitons (electron-hole pairs). The electrons may be transferred to a conductive band of the quantum dots while the holes may be transferred to a counter electrode (anode). In these circumstances, the quantum dots have two functions. One function is to absorb photons and generate electrons and holes, as discussed above. A second function is to transfer the electrons that are generated within the hole conductor to a conductive band of the electron conductor.

An experiment was conducted to test the ability of 4-mercaptobenzoic acid (MBA) to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 0.1 ml of the CdSe solution (in hexane), 0.1 ml MBA solution (0.1 molar MBA in ethanol), 0.05 ml of titanium dioxide colloid and 0.9 ml of a 1:1 volumetric mixture of ethanol and tetrahydrofuran. The solution was allowed to react. The resultant product was centrifuged at 3000 rpm for a period of two minutes. After discarding the supernatant, the remaining pellet was tested.

Figure 3:
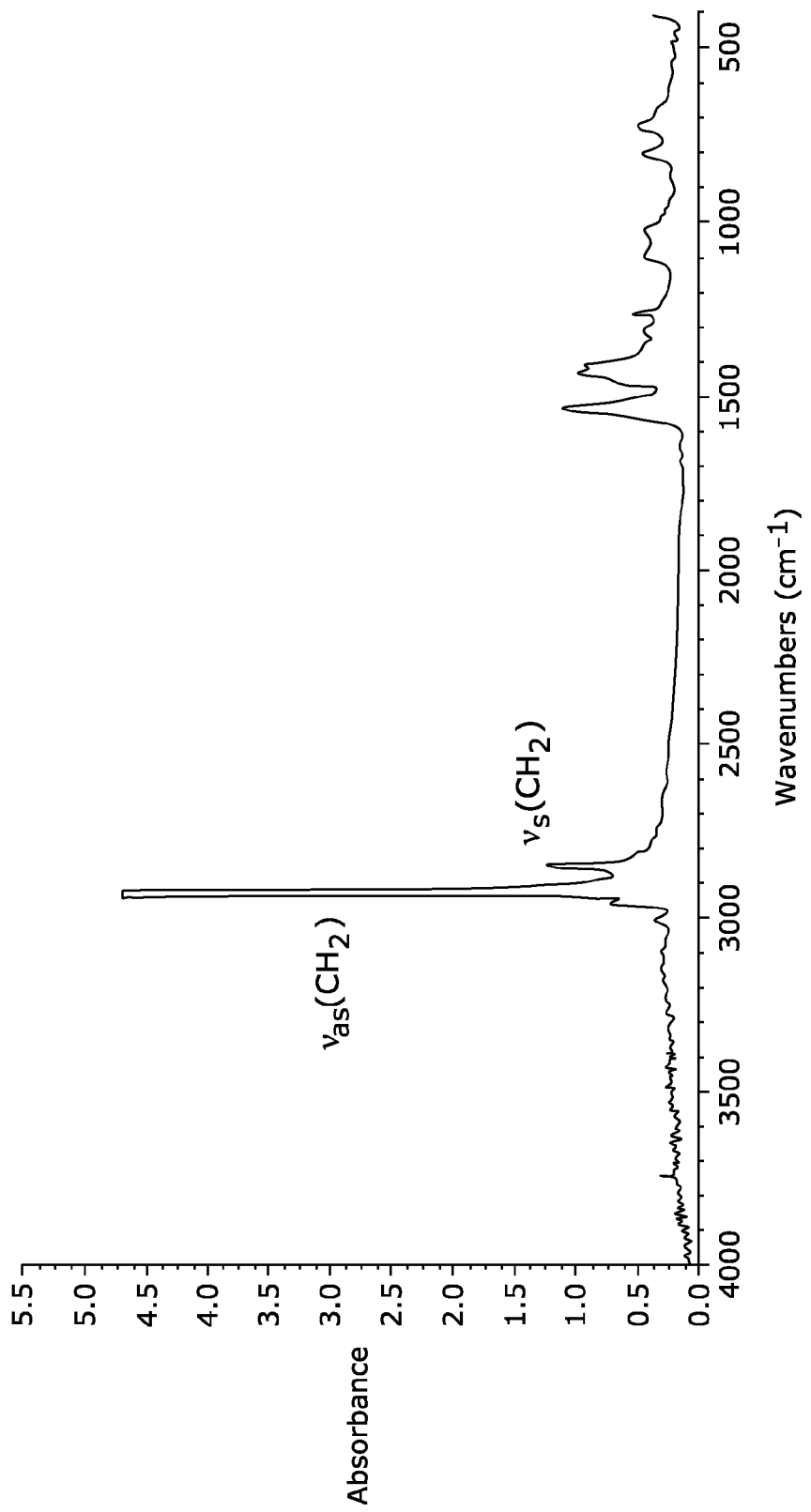
FIGS. 3 through 6 are graphical representations of certain experimental results.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 4:
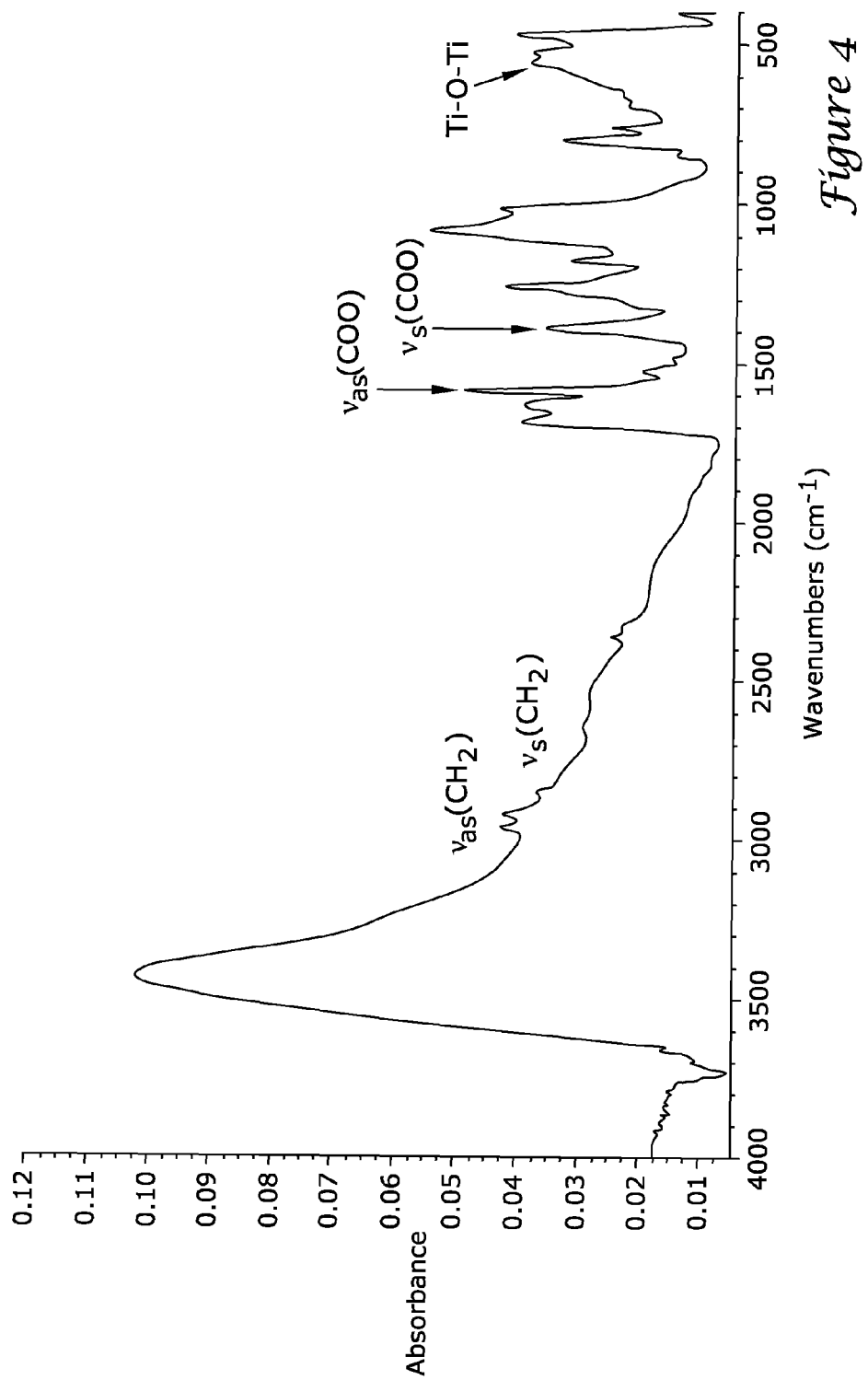

FIG. 4 provides the FTIR results pertaining to the pellet described above. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the MBA. Moreover, it can be seen that there are strong COO peaks as well as a Ti—O—Ti peak, indicating the presence of MBA on the $TiO_2$ surface.

An experiment was conducted to test the ability of dopamine to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 0.1 ml of the CdSe solution (in hexane), 1 ml dopamine solution (in ethanol) and 0.05 ml titanium dioxide colloid. The solution was allowed to react. The resultant product was centrifuged at 3000 rpm for a period of two minutes. After discarding the supernatant, the remaining pellet was tested.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 5:
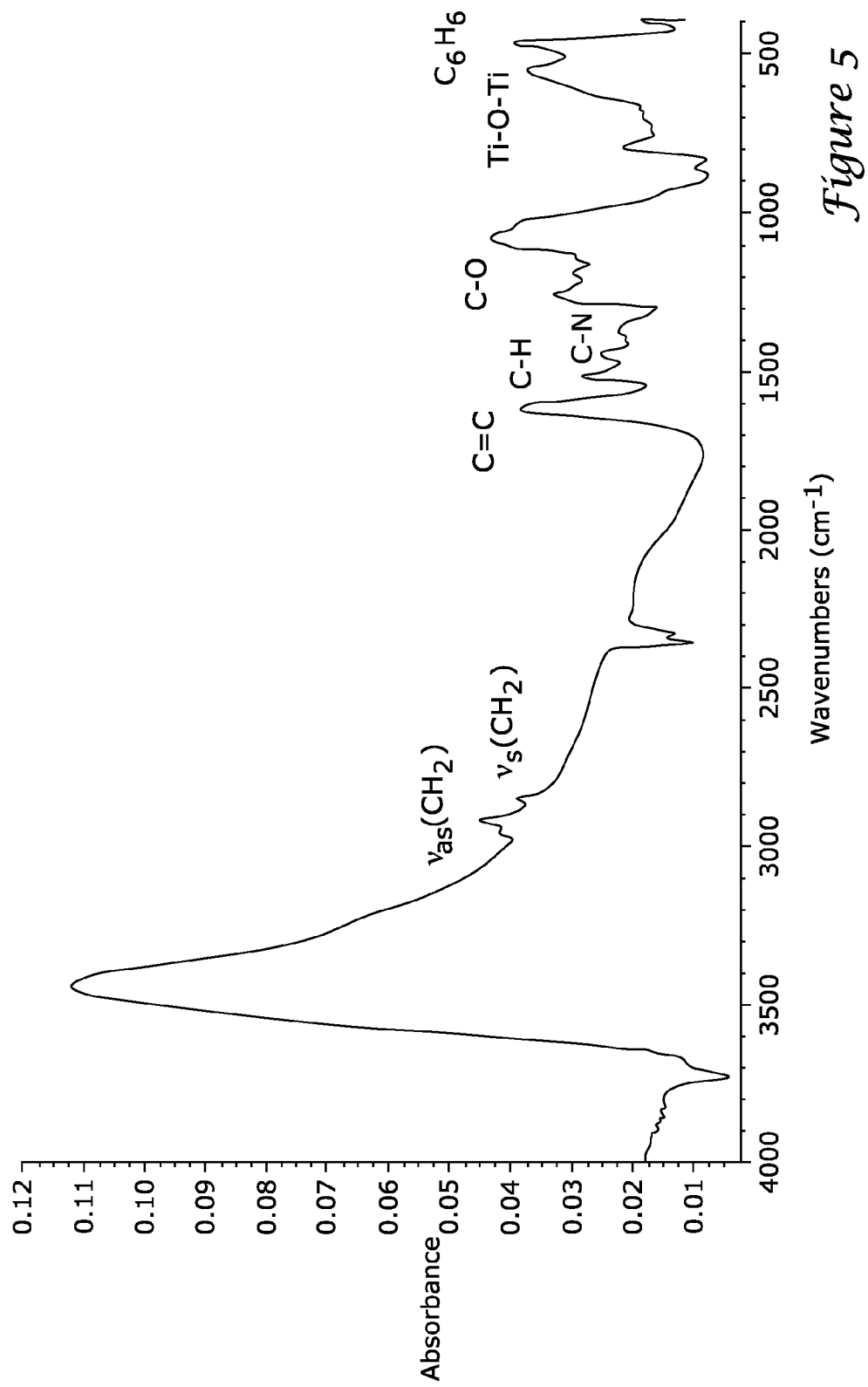

FIG. 5 provides the FTIR results pertaining to the pellet described above with respect to the dopamine linker. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the dopamine.

Moreover, there are now a number of peaks in the 500 $cm^{-1}$ to about 1650 $cm^{-1}$ range indicating the formation of a five membered ring. In particular, the five membered ring is formed between titanium, the oxygen atoms that were originally part of the two hydroxyl groups on the dopamine, and the two ring carbons to which the hydroxyl groups were bound.

An experiment was conducted to test the ability of 3,4-dihydroxybenzlamine to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 300 mg of 3,4-dihydroxybenzylamine hydrobromide with 10 ml of ethanol. A reaction solution was formed by combining 0.1 ml of the CdSe solution and 1 ml of the previously-formed dihydroxybenzylamine hydrobromide solution. The reaction solution was subjected to ultrasonic agitation for 5 minutes, and was then centrifuged at 3000 rpm for two minutes. After discarding the supernatant, the remaining pellet was tested.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 6:
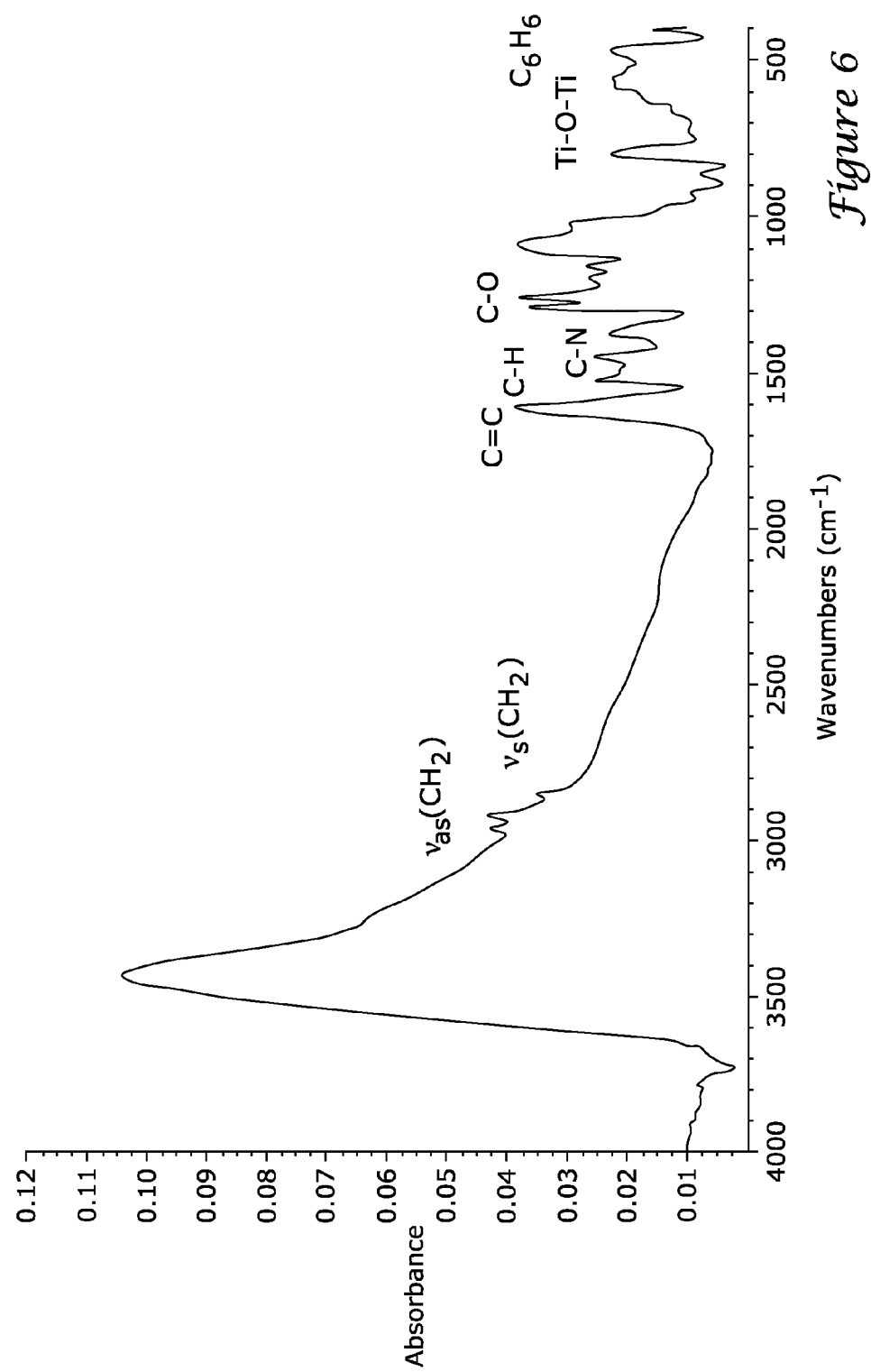

FIG. 6 provides the FTIR results pertaining to the pellet described above with respect to the 3,4-dihydroxybenzlamine linker. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the 3,4-dihydroxybenzlamine.

Moreover, there are now a number of peaks in the 500 $cm^{-1}$ to about 1650 $cm^{-1}$ range indicating the formation of a five membered ring. In particular, the five membered ring is formed between titanium, the oxygen atoms that were originally part of the two hydroxyl groups on the dopamine, and the two ring carbons to which the hydroxyl groups were bound.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

We claim:

1. A solar cell comprising:
    a quantum dot layer comprising a plurality of quantum dots;
    an electron conductor layer;
    a bridge molecule layer disposed between the quantum dot layer and the electron conductor layer; and
    a hole conductor layer disposed in contact with the quantum dot layer;
    wherein the bridge molecule layer comprises a plurality of bridge molecules, at least some of the plurality of bridge molecules having an electron rich anchor group bonded to at least one of the plurality of quantum dots and an electron conductor anchor bonded to the electron conductor layer, wherein at least some of the electron rich anchor groups comprise a diazo compound.

2. The solar cell of claim 1, wherein the electron conductor layer comprises an n-type semiconductor.

3. The solar cell of claim 1, wherein the hole conductor layer comprises a conductive polymer.

4. The solar cell of claim 1, wherein the hole conductor layer comprises an electrolyte.

5. The solar cell of claim 1, wherein the hole conductor layer comprises a p-type conductor.

6. A solar cell comprising:
    a quantum dot layer comprising a plurality of quantum dots;
    an electron conductor layer;
    a bridge molecule layer disposed between the quantum dot layer and the electron conductor layer; and
    a hole conductor layer disposed in contact with the quantum dot layer;
    wherein the bridge molecule layer comprises a plurality of bridge molecules, at least some of the plurality of bridge molecules having an electron rich anchor group bonded to at least one of the plurality of quantum dots and an electron conductor anchor bonded to the electron conductor layer;
    wherein at least some of the electron rich anchor groups quantum dot anchors are selected from the group consisting of

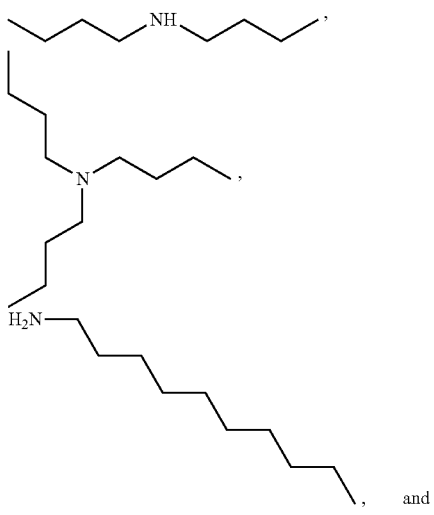

, and

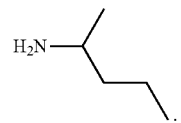

.

7. A solar cell comprising:
    a quantum dot layer comprising a plurality of quantum dots;
    an electron conductor layer;
    a bridge molecule layer disposed between the quantum dot layer and the electron conductor layer; and
    a hole conductor layer disposed in contact with the quantum dot layer;
    wherein the bridge molecule layer comprises a plurality of bridge molecules, at least some of the plurality of bridge molecules having an electron rich anchor group bonded to at least one of the plurality of quantum dots and an electron conductor anchor bonded to the electron conductor layer;
    wherein at least some of the electron rich anchor groups are selected from the group consisting of

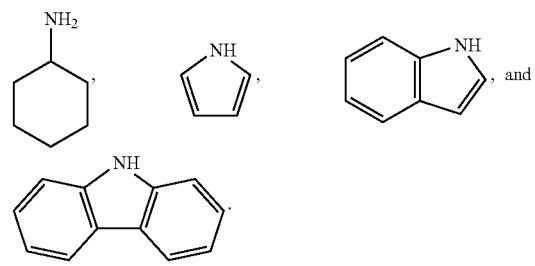

8. A solar cell comprising:
    a quantum dot layer comprising a plurality of quantum dots;
    an electron conductor layer;
    a bridge molecule layer disposed between the quantum dot layer and the electron conductor layer; and
    a hole conductor layer disposed in contact with the quantum dot layer;
    wherein the bridge molecule layer comprises a plurality of bridge molecules, at least some of the plurality of bridge molecules having an electron rich anchor group bonded to at least one of the plurality of quantum dots and an electron conductor anchor bonded to the electron conductor layer;
    wherein at least some of the electron conductor anchors comprise a phosphonic acid moiety.

9. A solar cell comprising:
    a quantum dot;
    a conducting substrate;
    bridge molecule disposed between the quantum dot and the conducting substrate, the bridge molecule comprising an electron rich anchor group bonded to the quantum dot and a conducting substrate anchor bonded to the conducting substrate;
    wherein at least some of the electron rich anchor groups comprise a diazo compound; and
    a hole conductor configured to reduce the quantum dot once the quantum dot absorbs a photon and ejects an electron through the bridge molecule and into the conducting substrate.

10. A solar cell comprising:

a quantum dot;

a conducting substrate;

bridge molecule disposed between the quantum dot and the conducting substrate, the bridge molecule comprising an electron rich anchor group bonded to the quantum dot and a conducting substrate anchor bonded to the conducting substrate;

a hole conductor configured to reduce the quantum dot once the quantum dot absorbs a photon and ejects an electron through the bridge molecule and into the conducting substrate; and wherein at least some of the electron rich anchor groups are selected from the group consisting of

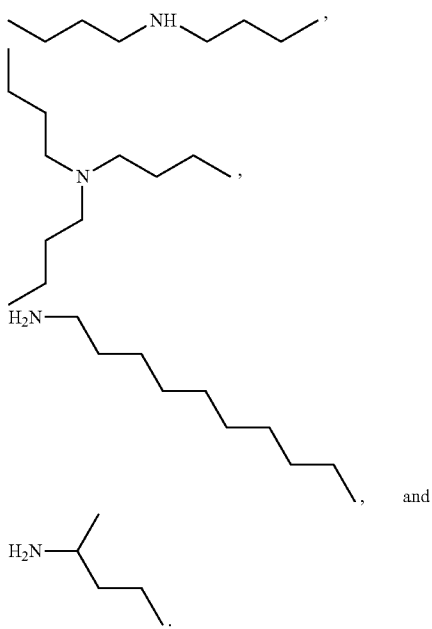

11. A solar cell comprising:

a quantum dot;

a conducting substrate;

bridge molecule disposed between the quantum dot and the conducting substrate, the bridge molecule comprising an electron rich anchor group bonded to the quantum dot and a conducting substrate anchor bonded to the conducting substrate;

a hole conductor configured to reduce the quantum dot once the quantum dot absorbs a photon and ejects an electron through the bridge molecule and into the conducting substrate; and wherein at least some of the electron rich anchor groups are selected from the group consisting of

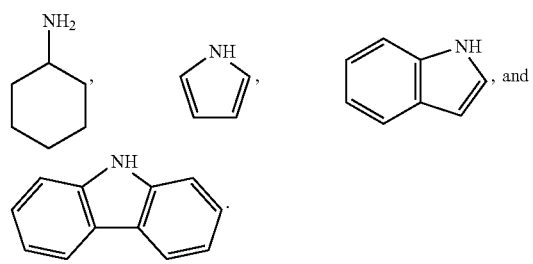

12. A solar cell comprising:

a quantum dot;

a conducting substrate;

bridge molecule disposed between the quantum dot and the conducting substrate, the bridge molecule comprising an electron rich anchor group bonded to the quantum dot and a conducting substrate anchor bonded to the conducting substrate;

a hole conductor configured to reduce the quantum dot once the quantum dot absorbs a photon and ejects an electron through the bridge molecule and into the conducting substrate; and wherein at least some of the conducting substrate anchors comprise a phosphonic acid moiety.

13. A light sensitive assembly, comprising:

a quantum dot;

an electron conductor; and a bridge molecule disposed between the quantum dot and the electron conductor, the bridge molecule comprising an electron rich anchor bonded to the quantum dot and a electron conductor anchor bonded to the electron conductor, wherein the electron rich anchor comprises a diazo compound having the structure:

where R is an aliphatic or aromatic group.

14. A light sensitive assembly, comprising:

a quantum dot;

an electron conductor;

a bridge molecule disposed between the quantum dot and the electron conductor, the bridge molecule comprising an electron rich anchor bonded to the quantum dot and a electron conductor anchor bonded to the electron conductor; and wherein the electron rich anchor comprises

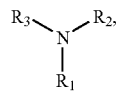

where $R_1$, $R_2$ and $R_3$ are each independently linear alkyl, branched alkyl, or cycloalkyl, or where $R_1$ and $R_2$ each form part of a ring and $R_3$ is hydrogen, and the nitrogen atom has a p orbital that is perpendicular to a $sp^2$ plane.

* * * * *